US008513944B2

(12) United States Patent
Rodmacq et al.

(10) Patent No.: US 8,513,944 B2
(45) Date of Patent: Aug. 20, 2013

(54) THREE-LAYER MAGNETIC ELEMENT, MAGNETIC FIELD SENSOR, MAGNETIC MEMORY AND MAGNETIC LOGIC GATE USING SUCH AN ELEMENT

(75) Inventors: Bernard Rodmacq, Veurey Voroize (FR); Stéphane Auffret, Vaulnaveys le Haut (FR); Bernard Dieny, Lans en Vercors (FR); Lavinia Elena Nistor, Hunedoara (RO)

(73) Assignees: Commissariat a l'Energie Atomique et aux Energie Alternatives, Paris (FR); Centre National de la Recherche, Paris (FR)

( * ) Notice: Subject to any disclaimer, the term of this patent is extended or adjusted under 35 U.S.C. 154(b) by 262 days.

(21) Appl. No.: 12/903,519

(22) Filed: Oct. 13, 2010

(65) Prior Publication Data

US 2011/0163743 A1    Jul. 7, 2011

Related U.S. Application Data

(63) Continuation of application No. PCT/FR2009/051062, filed on Jun. 5, 2009.

(30) Foreign Application Priority Data

Jun. 9, 2008  (FR) ..................................... 08 53811

(51) Int. Cl.
*G01R 33/07*     (2006.01)
*G01R 33/02*     (2006.01)

(52) U.S. Cl.
USPC .......................................... 324/251; 324/252

(58) Field of Classification Search
USPC ................................................... 324/252, 251
See application file for complete search history.

(56) References Cited

U.S. PATENT DOCUMENTS

| 6,917,088 | B2 * | 7/2005 | Takahashi et al. ............ 257/422 |
| 6,920,062 | B2 | 7/2005 | Parkin |
| 2008/0151615 | A1 * | 6/2008 | Rodmacq et al. ............. 365/173 |

FOREIGN PATENT DOCUMENTS

EP        0 505 783 A1      9/1992

OTHER PUBLICATIONS

Morawe et al. "*Structure and Thermal Stability of Sputtered Metal/Oxide Multilayers: The Case of Co/Al$_2$O$_3$,*" J. Appl. Phys. 77 (5), Mar. 1, 1995, p. 1969-1976.
Dieny et al. "*Spin-dependent Tunneling in Discontinuous Metal/Insulator Multilayers,*" Journal of Magnetism and Magnetic Materials 185 (1998), p. 283-292.

(Continued)

*Primary Examiner* — Jay Patidar
(74) *Attorney, Agent, or Firm* — Burr & Brown (57) ABSTRACT

A three-layer magnetic element comprises, on a substrate, a first oxide, hydride or nitride layer O having a metal magnetic layer M mounted thereon, the latter having either a second oxide, hydride or nitride layer O', or a non-ferromagnetic metal layer M' mounted thereon. Layer M is continuous, has a thickness of 1 to 5 nm and the magnetization thereof is parallel to the layer plane in the absence of layers O and O'. There is, for a range of temperature equal to or greater than ambient temperature, interfacial magnetic anisotropy perpendicular to the layer plane on interfaces O/M and M/O' that is capable of decreasing the effective demagnetizing field of layer M or orienting the magnetization of layer M in a manner substantially perpendicular to the layer plane.

26 Claims, 8 Drawing Sheets

(56) References Cited

OTHER PUBLICATIONS

Beach et al. "*Co-Fe Metal/Native-Oxide Multilayers: A New Direction in Soft Magnetic Thin Film Design I. Quasi-Static Properties and Dynamic Response*," IEEE Transaction on Magnetics, vol. 41. No. 6, Jun. 2005, p. 2043-2052.

Beach et al. "*Co-Fe Metal/Native-Oxide Multilayers: A New Direction in Soft Magnetic Thin Film Design II. Microscopic Characteristics and Interactions*," IEEE Transactions on Magnetics, vol. 41, No. 6, Jun. 2005, p. 2053-2063.

Christides et al. "*Polarity of Anomalous Hall Effect Hysteresis Loops in [Pt/Co]$_{15}$/AF/[Co/Pt]$_{15}$(AF=FeMn, NiO) Multilayers With Perpendicular Anisotropy*," Journal of Applied Physics 97, 013901 (2005), p. 1-7.

B. Rodmacq, et al., "*Crossovers from In-Plane to Perpendicular Anisotropy in Magnetic Tunnel Junctions as a Function of the Barrier Degree of Oxidation*," Journal of Applied Physics, American Institute of Applied Physics, vol. 93, No. 10, May 15, 2003, pp. 7513-7515.

F. Garcia, et al., "*Exchange-Biased Spin Valves with Perpendicular Magnetic Anisotropy Based on (Co/Pt) Multilayers*," Journal of Applied Physics, American Institute of Applied Physics, vol. 93, No. 10, May 15, 2003, pp. 8397-8399.

J. Moritz, et al. "*Extraordinary Hall Effect in Thin Magnetic Films and Its Potential for Sensors, Memories and Magnetic Logic Applications*," Journal of Physics D: Applied Physics, vol. 41, No. 13, Jun. 6, 2008, pp. 135001.

T. Nawrath, et al. "*Magnetic Anisotrophies and Magnetotransport in CeH$_2$/Co Multilayers*," Physical Review, B. Condensed Matter, American Institute of Physics, vol. 55, No. 5, Feb. 1, 1997, pp. 3071-3082.

\* cited by examiner

THREE-LAYER MAGNETIC ELEMENT, MAGNETIC FIELD SENSOR, MAGNETIC MEMORY AND MAGNETIC LOGIC GATE USING SUCH AN ELEMENT

FIELD OF THE INVENTION

The present invention relates to the field of magnetic materials, more especially those intended to be used as magnetic field sensors or in magnetic memories used to store and read data in electronic systems or even to produce components that can be used in the field of reprogrammable logic devices.

BACKGROUND OF THE INVENTION

One of the applications to which the present invention relates concerns magnetic elements that are used to detect magnetic fields on the basis of measuring the extraordinary Hall effect.

There are two types of Hall effect: the ordinary Hall effect and the extraordinary Hall effect. The ordinary Hall effect occurs in metallic materials or doped semiconductors and is due to the Lorentz force that acts on electrons under the influence of a magnetic field. The extraordinary Hall effect occurs to a limited extent in ferromagnetic materials and is the result of diffusion of electrons due to spin-orbit interaction with the magnetic moments of the ferromagnetic material.

One characteristic parameter of the Hall effect is the Hall resistivity which is given by the following equation:

$$\rho_{xy}=(V_{xy}/I)t=R_0H+4\pi R_s M_z \tag{1}$$

where:
  $V_{xy}$ is the Hall voltage measured in the plane of the thin film in a direction perpendicular to that of the electric current,
  I is the intensity of the current that flows in the plane of the thin film,
  t is the thickness of the thin film,
  $R_0$ is the ordinary Hall coefficient,
  H is the amplitude of the applied magnetic field,
  $R_s$ is the extraordinary Hall coefficient and $M_z$ is the perpendicular component of the magnetisation of the thin film.

The first term of equation (1), $R_0H$, corresponds to the ordinary Hall resistivity and the second term, $4\pi R_s M_z$, corresponds to the extraordinary Hall resistivity. For relatively weak magnetic fields, the ordinary Hall effect is generally several orders of magnitude smaller than the extraordinary Hall effect and can therefore be ignored.

If the magnetisation of the ferromagnetic film is parallel to the plane, which is generally the case for thin films, its perpendicular component $M_z$, increases linearly with the applied out-of-plane magnetic field until saturation magnetisation $M_s$ is reached. Therefore, as long as $M_z$ is less than $M_s$ the extraordinary Hall voltage is proportional to the applied magnetic field.

Figure 1:
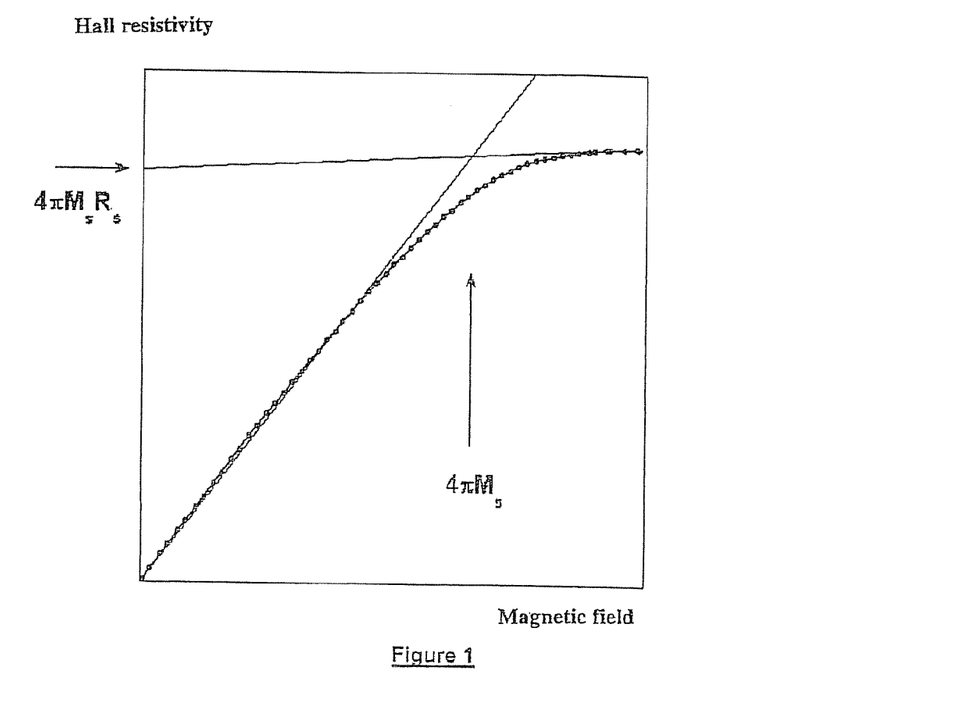
FIG. 1 is a schematic view of the characteristic magnetisation curve of a magnetic element according to the prior art.

FIG. 1 schematically shows variation in Hall resistivity as a function of the applied magnetic field for a thin-film magnetic material whose magnetisation is parallel to the plane. For $H<4\pi M_s$, resistivity varies linearly with the applied field until $\rho_{xy}=4\pi R_s Ms$ is reached. Beyond this point, resistivity varies linearly with the applied field with a slope $R_0$ (first term of equation (1)) which is much smaller, as indicated previously. The useful operating region of a magnetic field sensor based on this principle is therefore confined to magnetic field values less than $4\pi M_s$, where $M_s$ is the saturation magnetisation of the magnetic material in question.

It is the slope of the $\rho_{xy}(H)$ slope that determines the magnetic field sensitivity of such a sensor, expressed in microhms centimeter per tesla (μΩcm/T). This slope can also, taking into account the thickness of the thin film t and depending on the relation $\rho_{xy}=t\times R_{xy}$, be expressed in ohms per tesla (Ω/T). In order to maximize this slope, one can either increase the extraordinary Hall effect term $R_s$ or reduce the planar magnetic anisotropy of the material in order to reduce the perpendicular saturation field.

It is useful to choose a material with high longitudinal resistivity and high spin-orbit diffusion in order to maximize $R_s$. Such high longitudinal resistivity is also an advantage because, for small-sized devices, it makes it possible to preserve a sufficient voltage response whilst limiting the current that flows in said device to values that can be withstood, below the value that will cause irreversible structural modifications (electromigration phenomena).

High longitudinal resistivity is obtained either by increasing the atomic disorder of the material (a disordered alloy for example) or by reducing the thickness of the film (it is known that, for an extremely thin film, electrical resistivity varies approximately inversely to the thickness of the film). The contribution made by spin-orbit diffusion is augmented by choosing a material that contains elements with a high atomic number, platinum, palladium, gold or metals in the lanthanide series for instance.

It should nevertheless be noted that the incorporation of such materials must necessarily be limited in terms of their concentration in order to preserve the satisfactory magnetic properties of the ferromagnetic alloy.

The second way of increasing the slope of the $\rho_{xy}(H)$ curve is to reduce the planar magnetic anisotropy of the material, i.e. introduce an additional term of opposite sign to the conventional term $4\pi M_s$. The origin of this term denoted by $H_S$ can be volume anisotropy of magnetocrystalline origin, volume anisotropy induced by elastic growth strains or interface anisotropy due to interfacial electronic interactions. The influence of a layer of platinum in contact with a magnetic layer of cobalt, nickel or iron is a typical case, for example.

When this additional term is present, perpendicular anisotropy field $H_K$ can be expressed as follows:

$$H_K=4\pi M_s-H_S \tag{2}$$

Qualitatively, perpendicular anisotropy field $H_K$ will therefore reduce uniformly as $H_S$ increases, magnetisation of the magnetic layer always being parallel to the plane until it approaches zero, the limit beyond which, when $H_S$ exceeds $4\pi M_s$, magnetisation of the magnetic layer will spontaneously (i.e. without any applied magnetic field) be perpendicular to the layer plane. In this latter case, the magnetic material has two stable states in a zero field and can therefore be integrated into devices such as magnetic memories or magnetic logic gates.

Figure 2:
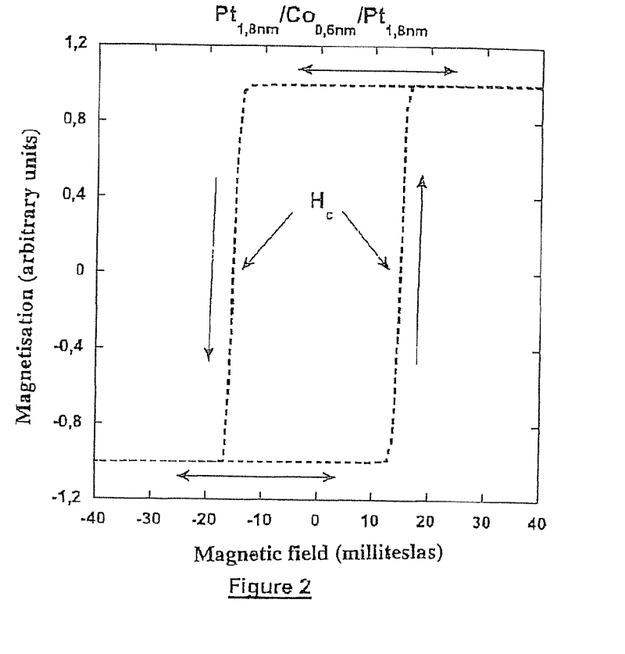
FIG. 2 is a schematic view of the typical variation in magnetisation as a function of magnetic field for a material with perpendicular magnetic anisotropy.

FIG. 2 is a schematic view of the magnetisation curve obtained in this situation for a typical sample having the following composition: $Pt_{1.8\,nm}/Co_{0.6\,nm}/Pt_{1.8\,nm}$. This curve can be obtained either by traditional magnetometric measurement, by measuring the Hall effect, by measuring the Kerr effect or the Faraday magneto-optical effect.

The arrows show the direction of travel of the magnetic cycle when excitation field H indicated on the x-axis is applied. The unidirectional arrows represent irreversible cycle changes, whereas the bidirectional arrows represent reversible cycle changes. Magnetisation levels are given in arbitrary units on the y-axis.

By gradually reducing the applied magnetic field from a positive value, for example, to a zero value, magnetisation of the magnetic layer remains perpendicular to its plane and oriented in the direction of the previously applied magnetic field. It is then necessary to apply a magnetic field of opposite direction having a more or less large amplitude in order to re-orientate magnetisation of the layer, still in a direction perpendicular to its plane, but in an opposite direction, namely in the direction of this new applied magnetic field.

The magnetic field required in order to obtain this change, more precisely the magnetic field that must be applied in order for magnetisation, averaged over all the magnetic domains, to be zero is referred to as the coercive field and is denoted by $H_c$ in FIG. 2. The value of this coercive field will determine magnetisation stability in one direction or the other in the event of exposure to external magnetic disturbances.

The stronger this coercive field, the more stable the material is when exposed to such disturbances. This also, however, makes it more difficult to deliberately modify the magnetisation direction by applying a perpendicular magnetic field, such as, for instance, when the material is used as a magnetic memory in which information is in fact coded by the magnetisation direction.

A weak coercive field that requires less energy to change magnetisation may therefore be preferable, with the possible need to magnetically "shield" the device against external magnetic disturbances or a strong coercive field may be preferred because it makes the device more stable (but consumes more energy when information is written to the device).

It should also be mentioned that one can use other ways of determining the orientation and amplitude of the magnetisation of a magnetic layer, for example magneto-optical effects whereby interaction between incident light and the magnetic moments of the magnetic layer cause rotation of the polarisation plane of the incident light and thus modification of its axial ratio.

To determine the orientation of the magnetisation of this magnetic layer, one can also add a second magnetic layer that is separated from the first layer by a layer of a non-magnetic metal or by an oxide layer with the direction of the magnetisation of this second layer being known. By measuring the electrical resistance of such a trilayer structure, one can determine the direction of the magnetisation of the first magnetic layer since the electrical resistance of this stack is smaller if both magnetisations are parallel compared with when magnetisations are antiparallel (the well-known giant or tunnel magnetoresistance phenomenon). Electric current may flow either in the plane of the layers or in a direction that is perpendicular to the layer plane if the sample has been cut into a post having lateral dimensions of the order of 1 µm or less.

To determine the orientation of the magnetisation of this magnetic layer, one can also position, close to the layer, a magnetoresistive read head that will be affected by the field radiated by the magnetic domains of this layer The literature contains examples of several materials that may have some of the properties explained above.

Examples include well-known cobalt/platinum multilayer systems that have high perpendicular magnetic anisotropy. Depending on the thicknesses of the elementary platinum and cobalt layers, the number of (Co/Pt) pattern repetitions and the presence of a platinum buffer layer, one can obtain a system having either magnetisation that is spontaneously (in a zero magnetic field) perpendicular to the plane of the layers or magnetisation in the layer plane but with extremely high perpendicular magnetic susceptibility (slope of curve $M_z=f(H)$). Unfortunately, these materials have low longitudinal resistivity due to the low resistivity of their metallic components.

Structures similar to those in the present invention have also been studied (see B. Rodmacq, S. Auffret, B. Dieny, S. Monso, P. Boyer, "*Crossovers from in-plane to perpendicular anisotropy in magnetic tunnel junctions as a function of the barrier degree of oxidation*", Journal of Applied Physics, 2003, Vol. 93, p. 7513). They consist in stacking, on a substrate, successive layers of platinum, cobalt and alumina or reverse stacking one of the stacks proposed in this invention.

The amplitude of the Hall effect in these structures is relatively small, mainly due to the presence of a relatively thick platinum layer into which a non-negligible portion of the electric current that flows in the structure is diverted.

Stacked layers similar to those of the present invention have already been proposed in the literature, but not with a view to applications in magnetic field sensor, magnetic memory or magnetic logic component type devices.

Firstly, one can cite work on multilayers composed of cobalt layers alternating with alumina layers ($Al_2O_3$) (see Ch. Morawe, H. Zabel, "*Structure and thermal stability of sputtered metal/oxide multilayers: the case of Co/Al$_2$O$_3$*", Journal of Applied Physics, 1995, Vol. 77, p. 1969). The authors of this publication do not mention any perpendicular magnetic anisotropy property of these materials which is the subject of the present invention.

In addition, in contrast to the present invention, the authors do not intend these materials for use in the area of magnetic field sensors or magnetic memories or logic components based, in particular, on measuring the extraordinary Hall effect. In fact, the authors suggest using these materials only because of their structural properties in the context of mirrors for x-rays. This work falls outside the application area referred to by the present invention.

One can also cite work on "discontinuous" multilayers comprising layers of cobalt or cobalt-iron alloys alternating with layers of silicon dioxide $SiO_2$ or alumina $Al_2O_3$ (see B. Dieny, S. Sankar, M. R. McCartney, D. J. Smith, P. Bayle-Guillemaud, A. E. Berkowitz, "*Spin-dependent tunnelling in discontinuous metal/insulator multilayers*", Journal of Magnetism and Magnetic Materials, 1998, Vol. 185, p. 283). The authors use the term "discontinuous" to refer to the fact that the layers of cobalt or cobalt-iron alloy are not in the form of thin films of virtually uniform thickness but rather in the form of cobalt or cobalt-iron aggregates coated in the oxide matrix.

These systems are prepared by cathode sputtering by alternately depositing layers of magnetic metal and oxide layers. The atoms of cobalt or cobalt-iron tend to coalesce in the form of discontinuous blobs which result in a planar structure of more or less independent aggregates, depending on the thickness of the deposited metal embedded in the isolating matrix.

In these structures, only a "memory" of this thin layer of cobalt or cobalt-iron is retained and this situation is completely different to that considered in the present invention. No mention is made of any perpendicular magnetic anisotropy properties of these materials in these studies relating to discontinuous metal/insulator multilayers. Finally, the authors do not intend these materials for use in the area of magnetic field sensors or magnetic memories or logic components based, in particular, on measuring the extraordinary Hall effect. This work therefore falls outside the application area referred to by the present invention.

One can also cite work dealing with multilayers fabricated by depositing a cobalt-iron alloy followed by natural oxidation of the surface of this alloy in the presence of oxygen (see G. S. D. Beach, A. E. Berkowitz, "*Co—Fe metal/native-oxide multilayers: a new direction in soft magnetic thin film design I. Quasi-static properties and dynamic response*", IEEE Transactions on Magnetics, 2005, Vol. 41, p. 2043, and G. S.

D. Beach, A. E. Berkowitz, "*Co—Fe metal/native-oxide multilayers: a new direction in soft magnetic thin film design II. Microscopic characteristics and interactions*", IEEE Transactions on Magnetics, 2005, Vol. 41, p. 2053).

These multilayers have high electrical resistivity, a strong magnetic moment and considerable magnetic "softness" (ease with which magnetisation can be saturated in a direction parallel to the layer plane). The authors do not mention any special property in respect of the amplitude of the extraordinary Hall effect.

Although they present results that appear to indicate a tendency for a certain perpendicular anisotropy to occur for thin magnetic metal thicknesses, more detailed scrutiny of their results shows that the observed reduction in the amplitude of perpendicular anisotropy field $H_K$ is essentially due to a decrease in the term $4\pi M_s$ (see equation (2)) rather than to any contribution made by perpendicular anisotropy term $H_S$.

Similarly, the authors predict that magnetisation will spontaneously be perpendicular to the layer plane for magnetic metal thicknesses less than 1.1 nm, but, at the same time, present results for a thickness of 1.0 nm, i.e. below this limit, which nevertheless unambiguously show that, in this case, magnetisation is parallel to the layer plane and not perpendicular.

Finally, one can cite work dealing with stacks comprising two multilayers (Pt/Co) and (Co/Pt) separated by a NiO oxide layer (see C. Christides and Th. Speliotis, "*Polarity of anomalous Hall effect hysteresis loops in $(Pt/Co)_{15}/AF/(Co/Pt)_{15}$ (AF=FeMn, NiO) multilayers with perpendicular anisotropy*", Journal of Applied Physics, 2005, Vol. 97, p. 013901).

In this document, it appears that the two multilayers either side of the NiO layer have their magnetisation perpendicular to the layer plane in the absence of the NiO oxide layer. This is clearly apparent when comparing FIG. 2 (NiO layer present) and FIG. 3 (NiO layer absent), page 013901-3; these Figures show that, in both cases, the magnetisation of the magnetic layers is oriented at right angles to the layer plane. In contrast to the present invention, it is therefore not the presence of the separating NiO layer that lends this stack its perpendicular magnetic anisotropy properties.

The above considerations demonstrate that no currently known magnetic material combines all the necessary properties for use as a magnetic field sensor or magnetic memory, namely high longitudinal resistivity (at least several hundred μΩcm), high Hall resistivity (several percent of the longitudinal resistivity) and high perpendicular magnetic susceptibility (at least ten times higher than that of a conventional magnetic material with planar magnetisation, with an out-of-plane saturation field of the order of several dozen milliteslas), or even perpendicular magnetisation in a zero field for magnetic memory or magnetic logic gate type applications.

Moreover, for magnetic memory or magnetic logic gate type applications, known materials of the (Pt/Co) type or lanthanide series/transition metal alloys do not have all the required properties for this type of application (high electron spin polarisation (if magnetoresistance is used to detect the signal), good thermal stability during annealing, low corrosion).

SUMMARY OF THE INVENTION

The present invention proposes a means of producing a magnetic three-layer non-magnetic/magnetic/non-magnetic element, whereof the magnetisation of the magnetic layer is parallel to the layer plane in the absence of the two non-magnetic layers and which has an out-of-plane anisotropy field having a value that is close to or in excess of its demagnetising field so that the magnetic element is either extremely sensitive to the magnetic field which can be detected by measuring the extraordinary Hall effect or by measuring the magnetoresistance or the Kerr effect or the Faraday magneto-optical effect or has magnetisation that is spontaneously perpendicular to the layer plane in the absence of an applied magnetic field.

The material used makes it possible to combine the advantages of the various materials stated above, namely high perpendicular anisotropy making it possible to compensate or even exceed the inherent shape anisotropy of thin films and, in the particular case where the Hall effect is measured, high longitudinal resistivity and a high extraordinary Hall coefficient.

Thus, the invention relates to a three-layer magnetic element comprising, on a substrate, an oxide, hydride or nitride layer O having a metal magnetic layer M mounted thereon, the latter having either a second oxide, hydride or nitride layer O', or a non-ferromagnetic metal layer M' mounted thereon, thereby producing generic O/M/O or O/M/M' type structures wherein layers M are continuous.

The high perpendicular magnetic anisotropy mentioned above is obtained, as in the case of cobalt/platinum multilayers, by strain and interfacial electronic hybridization effects at the interfaces between the magnetic layer and the oxide, hydride or nitride layer(s). As in the (Co/Pt) system, the magnetic layer must therefore be thin (several nm) in order for these interfacial effects not to become negligible compared to the volume shape anisotropy which tends to keep magnetisation in the plane of the layer.

High longitudinal resistivity is obtained by using magnetic thin films that are therefore highly resistive due to the important role played by interfacial diffusions that occur in contact with one or more oxide, nitride or hydride layers. The electrical resistance of the entire stack is therefore high.

According to the invention, magnetic metal layer M has a thickness of 1 to 5 nm and consists of a magnetic material, a magnetic alloy or a multilayer formed by an alternating sequence of non-magnetic and magnetic materials, the latter being selected from the group comprising Fe, Ni, Co or alloys thereof.

In addition, the oxide, hydride or nitride layer(s) O and O' has/have a thickness of at least 0.3 nm and are based on elements selected from the group comprising Al, Mg, Ru, Ta, Cr, Zr, Hf, Ti, V, Si, Cu, W, Co, Ni, Fe or alloys thereof and, more generally, any material or alloy capable of forming stable oxides, hydrides or nitrides.

Advantageously, the substrate that receives the above-mentioned stack is made of silicon covered in thermally or naturally oxidized or nitrided silicon to a depth of 2 to 500 nm.

However, said substrate can also be made of a transparent material such as glass or magnesium oxide for example.

According to another advantageous aspect of the invention, magnetic metal layer M contains added non-magnetic metals Pd or Pt that are used to modify the perpendicular magnetic anisotropy properties of this layer or elements selected from the group comprising Si, C, B, P, N that are used to modify the electrical resistivity of this layer and/or its magnetisation per volume unit.

According to the invention, layer(s) O and O' is/are made of the same non-magnetic material. However, the chemical composition of one of layers O may differ from the other layer. In addition, both layers O and O' may or may not have the same thickness.

According to the invention, at least one of layers O or O' may itself consist of a plurality of layers made of oxide, hydride or nitride.

Advantageously:
magnetic metal layer M has a thickness of 1 to 5 nm,
layer(s) O or O' has/have a thickness of 0.3 to 5 nm.
non-ferromagnetic layer M' has a thickness of 0.3 to 20 nm, The magnetic element according to the invention advantageously has lateral dimensions of less than 1 µm.

The invention also relates to a method for producing the magnetic element in question. This method involves:
- depositing, on an electrically insulating surface, a first layer of metal that constitutes layer O by cathode sputtering,
- oxidation, hydriding or nitriding this first layer O,
- depositing, on this first layer O or directly on the substrate, a magnetic metal layer M by cathode sputtering,
- depositing, by cathode sputtering, on this magnetic metal layer M, either a second layer of a metal that constitutes layer O' and is subsequently oxidised, nitrided or hydrided, or a metal layer M',
- establishing electrical contacts with layer M if there is a requirement to measure the properties of the magnetic element by injecting an electric current and measuring a voltage.

Alternatively, the first and second steps may only consist of a single step, namely direct deposition by radiofrequency sputtering, for example, of the oxide, hydride or nitride layer using a target comprising the corresponding oxide, hydride or nitride.

Using the method according to the invention, the element is cut into a post with a square, rectangular, circular or elliptical base having lateral dimensions of several hundred nm or less. It may also be cut, still retaining the same range of dimensions, into a shape that makes it possible to detect the magnetic signal by measuring the extraordinary Hall effect.

According to one variant of the invention, layer(s) O or O' is/are obtained by natural oxidation, hydriding or nitriding of a metal layer.

According to another variant of the invention, layer(s) O or O' is/are obtained by plasma oxidation, hydriding or nitriding of a metal layer.

According to yet another variant of the invention, layer(s) O or O' is/are obtained by reactive sputtering of a metal layer in oxygen, hydrogen or nitrogen in the atmosphere inside the deposition chamber.

According to yet another variant of the invention, layer(s) O or O' is/are obtained by direct deposition of oxide, hydride or nitride by radiofrequency cathode sputtering using a composite metallic oxide, hydride or nitride target material.

According to yet another variant of the invention, it is the substrate itself which comprises or is covered in an oxide, nitride or hydride, that acts as layer O.

According to the invention, certain layers are deposited at a temperature that is different from ambient temperature. For example, the structural quality of the oxide, hydride or nitride layer(s) may be improved if it is or they are grown at high temperature (200° C. for instance). Also, deposition of a layer may also be followed by heat treatment at a temperature higher than said deposition temperature. This may be the case, for example, in order to encourage oxidation or nitriding of a layer or to enable crystallization of an amorphous layer.

In addition, having completed the deposition steps, one may subject the assembly thus obtained to heat treatment for a longer or shorter period in a rarefied atmosphere or in the presence of a certain gas or mixture of different gases such as oxygen, hydrogen or nitrogen, for example, in order to modify the structure and/or electric transport properties and/or magnetic properties of the magnetic element.

The steps to deposit the various layers or to heat treat some or all of the layers that make up the stack can be performed in the presence of an external magnetic field that is capable of modifying the magnetic characteristics of the entire stack.

The invention relates to a magnetic field sensor consisting of the three-layer magnetic element according to the invention, the latter having a perpendicular anisotropy field that almost counterbalances its demagnetising field.

The invention also relates to a magnetic memory consisting of the three-layer magnetic element in question in which magnetisation of the magnetic layer is perpendicular to the layer plane in the absence of any external magnetic field.

The invention also relates to a magnetic logic gate consisting of said three-layer magnetic element in which magnetisation of the magnetic layer is perpendicular to the layer plane in the absence of any external magnetic field.

The invention can also be used, generally speaking, in magnetic domain wall displacement devices such as the shift registers proposed, for instance, in document U.S. Pat. No. 6,920,062. In these devices, information is stored in the form of a succession of domains, the magnetisations whereof are oriented "up" or "down". Every domain represents one information bit. They are separated by magnetic walls. The magnetic walls and therefore the domains can advantageously be displaced in these structures by injecting an electric current, this current flow exerts a force on the walls due to the spin-transfer effect. A magnetoresistive or Hall effect sensor placed in a given location close to or on the device makes it possible to detect movement of the walls and domains, this relating back to the magnetic information written in the device.

In order to determine the orientation of the magnetisation of the magnetic layer of the magnetic element:
- one measures the extraordinary Hall effect by injecting an electric current in a direction that is parallel to layer plane,
- or one measures the magnetoresistance by injecting an electric current in a direction that is perpendicular or parallel to the layer plane,
- or one measures the Kerr effect or the Faraday magneto-optical effect,
- or one uses the field radiated by the magnetic domains to influence a magnetoresistive read head located close to the magnetic element.

BRIEF DESCRIPTION OF THE DRAWINGS

These first two Figures have already been described in relation to the prior state of the art.

DETAILED DESCRIPTION OF THE INVENTION

Figure 3:
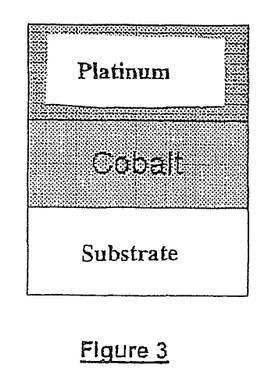
FIG. 3 is a schematic view of a first embodiment of the magnetic element according to the invention.

Non-limitatively and merely by way of example, the materials and techniques used in the embodiments described below are as follows:

FIG. 3 is a schematic view of a first embodiment of the invention. A magnetic layer M consisting, here, of cobalt and having a generally small thickness is deposited on a substrate which has the required characteristics to replace layer O and is covered, for example, in oxidised or nitrided silicon or composed, for example, of glass or magnesium oxide. If this thickness exceeds a specific value which depends on the material used for layer M and the intensity of the interfacial interactions with the materials that are in contact with this magnetic layer M, magnetisation is no longer, as is known, perpendicular to the layer plane due to the volume shape anisotropy of layer M which tends to keep magnetisation of the layer in-plane.

For this layer M, its thickness is selected and, above all, determined by the ability to obtain a continuous metal layer. In fact, as discussed earlier, some magnetic metals do not wet satisfactorily on oxides such as silicon dioxide or alumina. In some cases, the magnetic metal tends to coalesce in the form of more or less discontinuous blobs, depending on the thickness of the deposited metal.

One can then advantageously deposit, on this magnetic layer M, a layer of non-ferromagnetic metal M', for example platinum, in order to protect the entire structure thus produced against subsequent natural oxidation or to facilitate the flow of an electric current.

Figure 4:
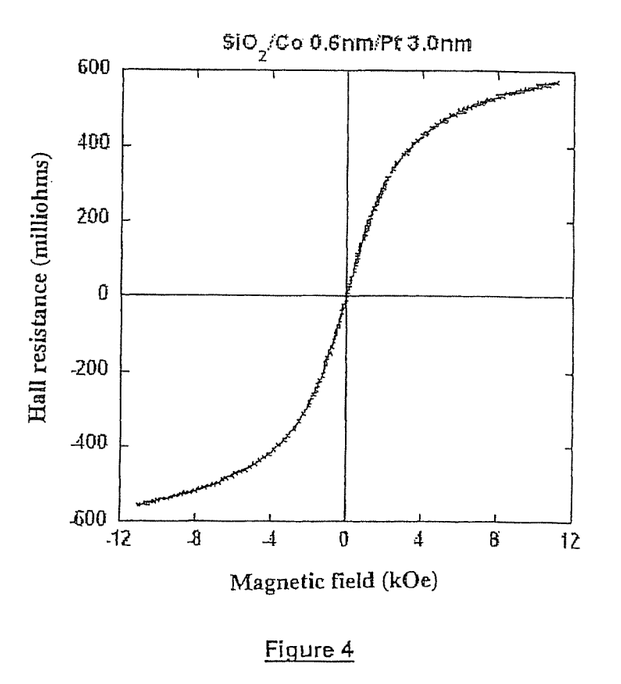
FIG. 4 shows variation in Hall resistance as a function of perpendicular magnetic field for a structure of the $SiO_2$/Co 0.6 nm/Pt 3.0 nm type.

FIG. 4 illustrates this embodiment. The stack comprises, on an oxidised silicon substrate, a 0.6 nm thick magnetic layer of cobalt mounted on a 3 nm thick platinum layer. One measures the variation in Hall resistance as a function of the external magnetic field applied perpendicular to the layer plane.

This FIG. 4 shows a regular, non-linear increase in Hall resistance as the magnetic field increases, in contrast, for instance, to the situation shown in FIG. 1, where it was easy to distinguish the two linear contributions to this resistance, the first being proportional to magnetisation (extraordinary contribution) and the second being, for stronger applied fields, proportional to the applied field (ordinary contribution). This means that in the case shown in FIG. 4 it is not possible to perfectly align the magnetisation of the cobalt layer in a direction parallel to the magnetic field, even with high-intensity fields. This is a property of so-called "superparamagnetic" materials for which the small blobs of cobalt are insufficiently magnetically stable in the presence of thermal agitation.

In other cases, the surface tension effects are too weak for coalescence into blobs to take place. The metal layer can then be continuous. The range of thicknesses making it possible to obtain a continuous layer of metal depends on the surface energy of the oxide, the surface energy of the metal, the interfacial energy of the oxide/metal interface and the wettability of the deposition surface due to the metallic filler layer. This possible thickness range in order to obtain continuous metal layers therefore depends on both metal M and the oxide.

In yet other cases, slightly increasing the thickness of the magnetic layer makes it possible to increase fractional surface coverage to a point where the above-mentioned blobs come into contact with each other, thus making it possible to achieve the desired magnetic properties.

For a given base material M, one can modify the thickness of the magnetic layer or restore the desired magnetic properties by adding elements to this magnetic material that are capable of improving wettability on the substrate by reducing the surface energy of the metal to improve the interfacial energy of the oxide/metal interface. Using one common production method, the material is a magnetic metal such as cobalt having a thickness of 1 to 5 nm, typically 1.5 nm.

Figure 5:
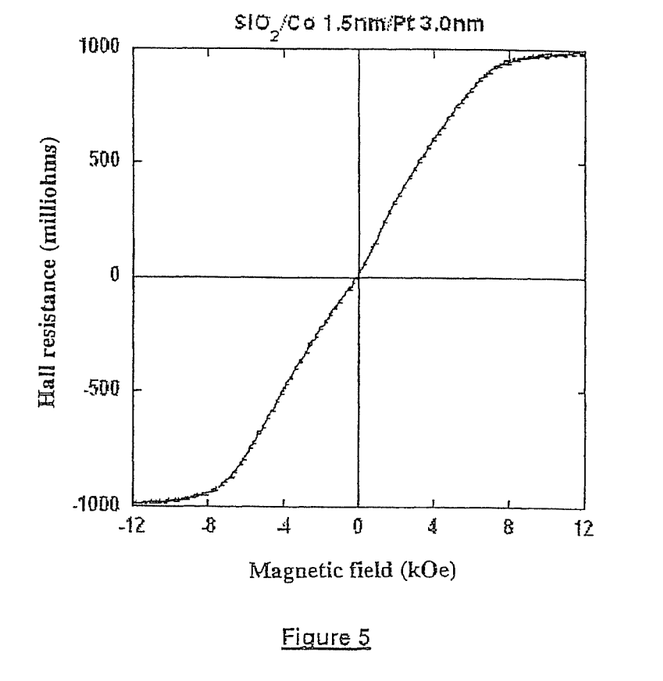
FIG. 5 shows variation in Hall resistance as a function of perpendicular magnetic field for a structure of the $SiO_2$/Co 1.5 nm/Pt 3.0 nm type.

This is the case illustrated in FIG. 5 which shows variation in Hall resistance as a function of the external magnetic field applied perpendicular to the layer plane for a stack of the (substrate/Co 1.5 nm/Pt 3 nm) type. In this case, the variation in Hall resistance is in conformity with that in FIG. 1 because it is possible to align the magnetisation of the cobalt layer in the direction of an external magnetic field having an intensity of approximately 8 kOe.

Bearing in mind equation (2), it is apparent in this case that there is a non-negligible perpendicular anisotropy contribution $H_S=4\pi M_s-H_K=18-8=10$ kOe; in this equation it is assumed that the magnetisation of the cobalt layer equals 1430 uem/cm$^3$.

In order to adapt the magnetic properties of the device to its intended application (field sensor, memory device or logic gate) and achieve improved performance, especially in terms of perpendicular magnetic anisotropy, the cobalt layer can be replaced by a Co$_x$Fe$_{1-x}$ alloy of variable concentration or by a Co$_x$Ni$_y$Fe$_{100-x-y}$ ternary alloy or by a crystallized or amorphous alloy of one or more of these magnetic materials with another non-magnetic element such as boron, silicon, phosphorus and/or carbon. One can also use an alloy or multilayer comprising a magnetic material and a non-magnetic material.

Figure 6:
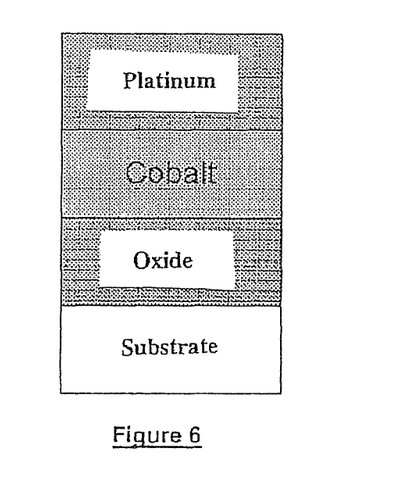
FIG. 6 is a schematic view of a second embodiment of the magnetic element according to the invention.

FIG. 6 is a schematic view of a second embodiment of the invention.

One deposits layer O, preferably made of aluminium oxide, on the above-mentioned substrate, the thickness of the layer is 0.3 to 5 nm but the latter figure is not very critical. This layer generally consists of deposited metal such as aluminium that has been oxidized for instance. However, aluminium can be replaced by any other element capable of combining with oxygen to form high-quality oxides in thin layers, namely and for example, magnesium, ruthenium, silicon, tantalum, chrome, zirconium, titanium, hafnium, vanadium, cobalt, nickel, iron, copper, tungsten and, more generally, any material or alloy capable of forming stable oxides. One can also use an alloy or a multilayer of these materials as an elementary oxide layer for certain particular embodiments.

Instead of using a plasma oxidation technique, it is also possible to produce the oxide by using a known technique of reactive sputtering of the element in question in the presence of a certain quantity of oxygen in the atmosphere inside the deposition chamber, or by using a natural oxidation method or by directly depositing the oxide by radiofrequency sputtering of a composite MOx target material where M denotes one of the metals mentioned above and Ox denotes oxygen.

Similar results are obtained by performing nitriding or hydriding rather than oxidation.

One then deposits magnetic layer M, for example cobalt, on this first oxide, hydride or nitride layer O and then one deposits, if applicable, a last non-ferromagnetic metal layer M', for example platinum, as indicated in the first embodiment of the invention described in relation to FIG. 3.

Figure 7:
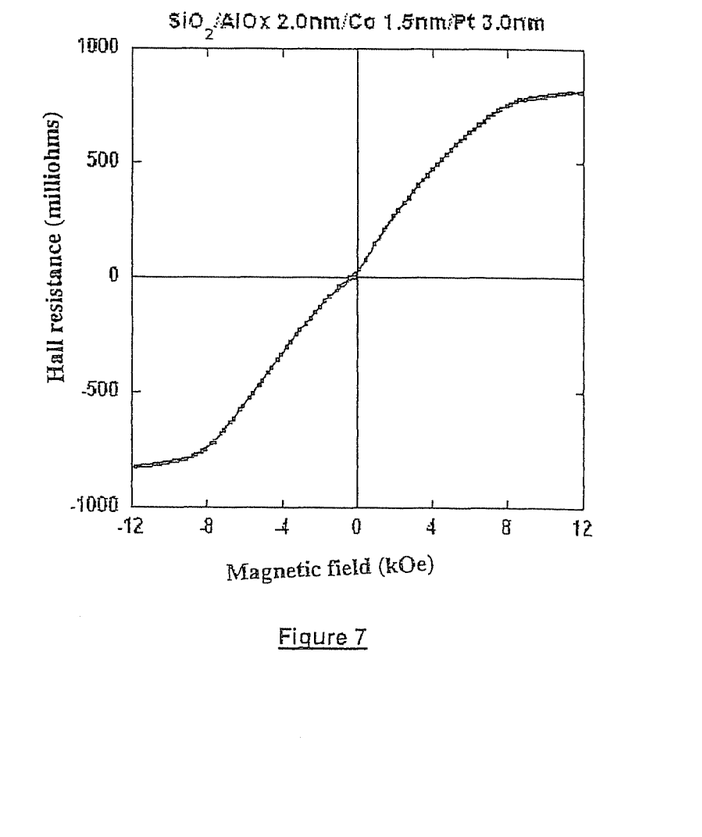
FIG. 7 shows variation in Hall resistance as a function of perpendicular magnetic field for a structure of the SiO$_2$/AlOx 2.0 nm/Co 1.5 nm/Pt 3.0 nm type. Oxygen plasma was used to oxidise the aluminium layer.

It is this second embodiment that is shown in FIG. 7. The stack comprises, on an oxidised silicon substrate, a 0.6 nm thick layer of aluminium that is exposed, after being deposited, to an oxygen atmosphere, then a 1.5 nm layer of cobalt mounted on a 3 nm thick layer of platinum. One measures the variation in Hall resistance as a function of the external magnetic field applied perpendicular to the layer plane.

As in the case of FIG. 5, the variation in Hall resistance is in conformity with that in FIG. 1 because it is possible to align the magnetisation of the cobalt layer in the direction of an external magnetic field having an intensity of approximately 8 kOe. The presence of a non-negligible perpendicular anisotropy contribution is therefore also apparent.

Figure 8:
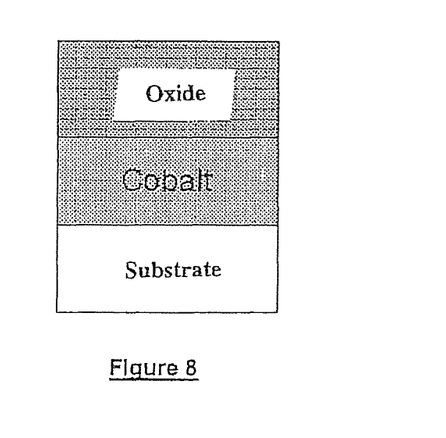
FIG. 8 is a schematic view of a third embodiment of the magnetic element according to the invention.
Figure 9:
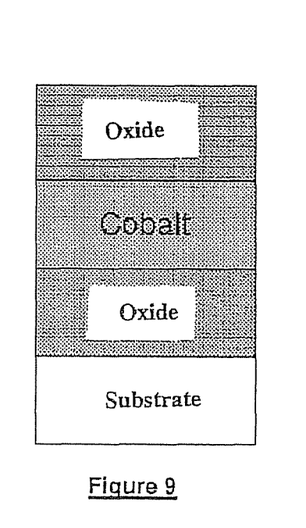
FIG. 9 is a schematic view of a fourth embodiment of the magnetic element according to the invention.

FIGS. 8 and 9 are schematic views of a third and a fourth embodiments according to the invention.

In this case, the upper non-ferromagnetic metal layer M' that is used in the first and second embodiments has been replaced by oxide layer O'. The main attraction of these embodiments is that any electric current injected in a direction parallel to the layer plane only flows in the magnetic layer. This therefore markedly improves the efficiency of the device if, for instance, this electric current is used in order to measure the Hall voltage or if this electric current is used in order to manipulate the magnetic state of the device, for example to displace magnetic domain walls as in document U.S. Pat. No. 6,920,062.

For these last two embodiments, the nature, chemical composition, thickness and fabrication method of the second oxide layer need not necessarily be identical to those of the substrate or the first oxide layer.

Figure 10:
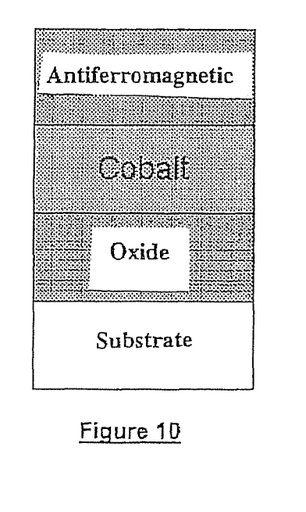
FIG. 10 is a schematic view of a fifth embodiment of the magnetic element according to the invention.

In a fifth embodiment shown schematically in FIG. 10, it is possible to bring layer M in question, here a layer made of cobalt, into contact with a layer of antiferromagnetic material M' such as IrMn, PtMn, FeMn or NiMn alloys which are known to induce exchange anisotropy coupling with said layer M.

Figure 11:
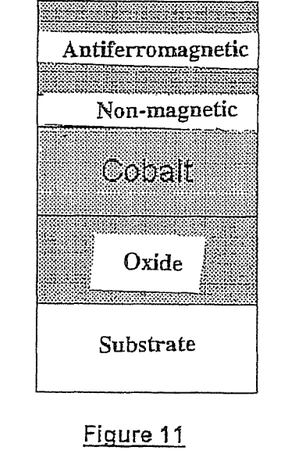
FIG. 11 is a schematic view of a sixth embodiment of the magnetic element according to the invention.

In a sixth embodiment shown schematically in FIG. 11, it is also possible to insert a non-magnetic metal layer, platinum for example, having a thickness of 0.1 to 1 nm between said layer M and said material known to induce exchange coupling with said layer M.

For any of the embodiments described above, it is possible to deposit successive layers or some of such layers on a substrate that is held at a temperature that is different to ambient temperature. It may also be useful to deposit materials in the presence of an external magnetic field.

In addition, having completed the deposition steps, one may subject the assembly thus obtained to heat treatment for a longer or shorter period in a rarefied atmosphere or in the presence of a certain gas or mixture of different gases such as oxygen, hydrogen or nitrogen, for example, in the presence or absence of an external magnetic field in order to modify the structure and/or electric transport properties and/or magnetic properties of the device.

Figure 12:
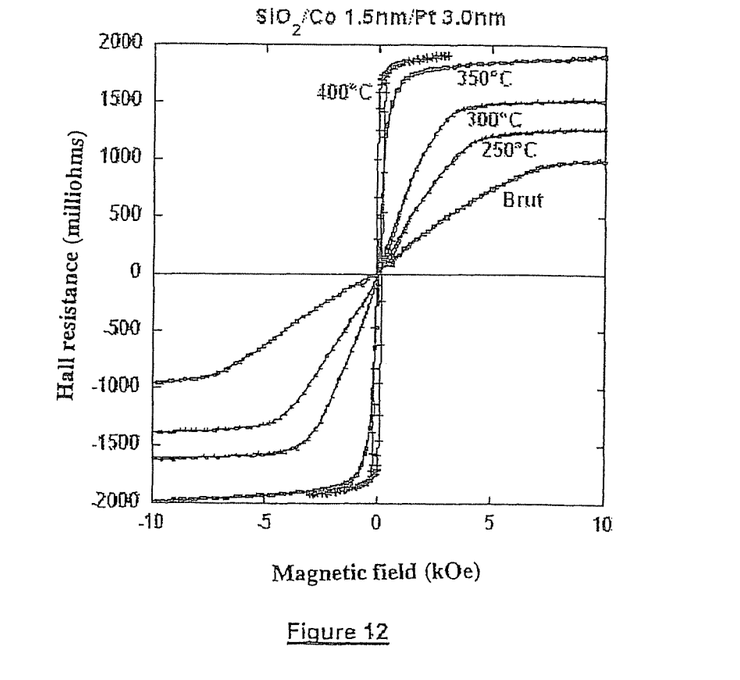
FIG. 12 shows variation in Hall resistance as a function of perpendicular magnetic field for a structure of the SiO$_2$/Co 1.5 nm/Pt 3.0 nm type for various annealing temperatures.
Figure 13:
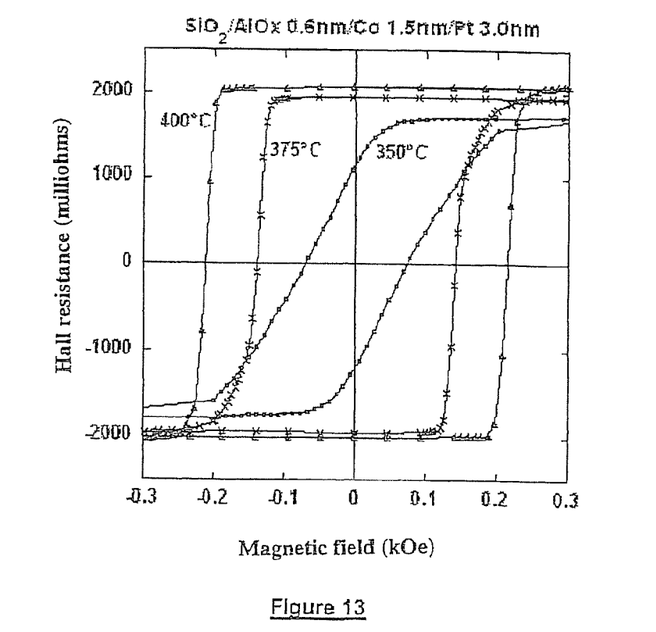
FIG. 13 shows variation in Hall resistance as a function of perpendicular magnetic field for a structure of the SiO$_2$/AlOx 0.6 nm/Co 1.5 nm/Pt 3.0 nm type for various annealing temperatures. Natural oxidation was used to oxidise the aluminium layer.
Figure 14:
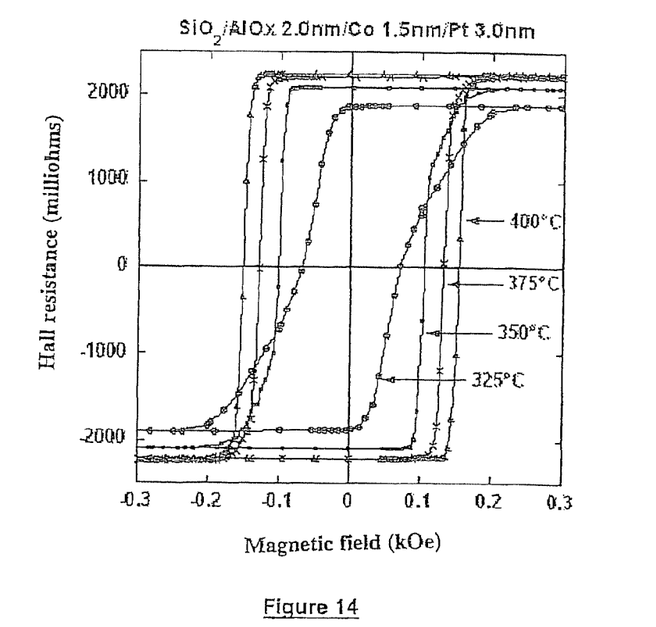
FIG. 14 shows variation in Hall resistance as a function of perpendicular magnetic field for a structure of the SiO$_2$/AlOx 2.0 nm/Co 1.5 nm/Pt 3.0 type for various annealing temperatures. Oxygen plasma was used to oxidise the aluminium layer.
Figure 15:
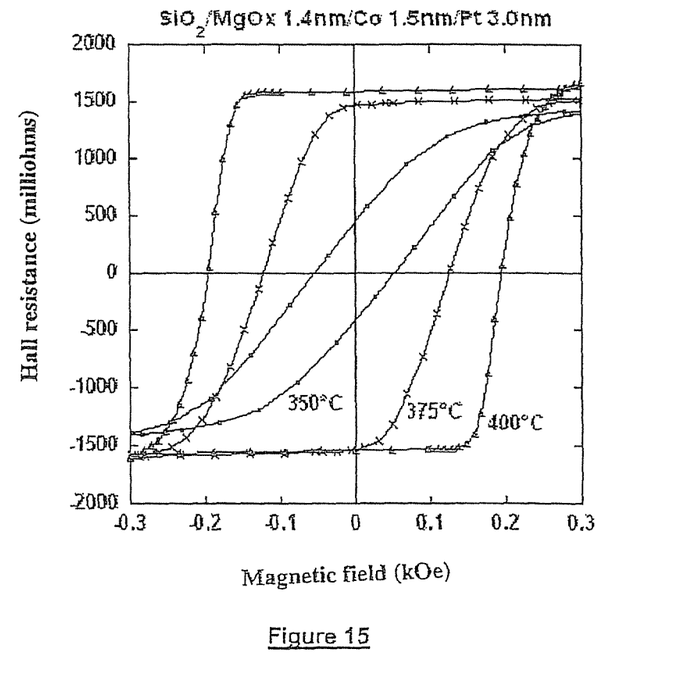
FIG. 15 shows variation in Hall resistance as a function of perpendicular magnetic field for a structure of the SiO$_2$/MgOx 1.4 nm/Co 1.5 nm/Pt 3.0 nm type for various annealing temperatures. Natural oxidation was used to oxidise the magnesium layer.

The effect of such post-deposition heat treatments is illustrated in FIG. 12 which uses the first embodiment and in FIGS. 13, 14 and 15 which use the second embodiment. In these cases, the stacks shown schematically in FIGS. 3 and 6 have, after deposition, been held at a temperature of 20° C. to 400° C. for 30 minutes in a rarefied $10^{-6}$ mbar atmosphere and then cooled to ambient temperature before measuring their magnetic properties again.

FIG. 12 corresponds to a stack of the substrate/M/M' type (first embodiment) where the substrate consists of silicon covered in 500 nm of silicon oxide; M represents a cobalt layer having a thickness of 1.5 nm covered by 3 nm thick platinum layer M'.

Firstly, it is clear in this Figure that there is a considerable increase in the amplitude of the Hall resistance following the various heat treatments. In fact, this amplitude increases by a factor of two after heat treatment at a temperature of 400° C. compared with the amplitude measured immediately after depositing the stack.

In addition, perpendicular saturation field $H_K$ (see equation (2)) diminishes gradually as the annealing temperature rises until it becomes negative (the magnetisation of the cobalt layer is then spontaneously perpendicular to the layer plane) after heat treatment at 400° C. For intermediate annealing temperatures, the slope of curve R(H) can reach very high values which make it possible to use this stack as a magnetic field sensor.

FIGS. 13, 14 and 15 correspond to the second embodiment illustrated in FIG. 6 and show variation in Hall resistance as a function of the magnetic field applied perpendicular to the layer plane for the various kinds of oxides used and after various annealing temperatures. FIG. 13 corresponds to a 0.6 nm thick aluminium layer that is subsequently exposed to an oxygen atmosphere. FIG. 14 corresponds to a 1.6 nm aluminium layer oxidised by a plasma process and FIG. 15 corresponds to a 1.4 nm magnesium layer subsequently exposed to an oxygen atmosphere.

In these three cases, appropriate heat treatment makes it possible to stabilise magnetisation of the cobalt layer in a direction that is perpendicular to the layer plane in the absence of an applied magnetic field.

If, for the second, fifth or sixth embodiment, one then deposits, before layer O of the stacks shown schematically in FIG. 6, 10 or 11, a first magnetic layer with magnetisation that is also perpendicular to the layer plane, this produces a magnetic tunnel junction type structure with magnetisations that are perpendicular to the layer plane.

It is therefore quite possible to modify the magnetic properties of this type of material as required through heat treatment in order to maximize the Hall resistance and/or adjust magnetisation stability with respect to an external magnetic field (i.e. its coercive field) depending on the intended application. These heat treatments also have the advantage of making the magnetic element far more structurally stable with respect to any subsequent temperature fluctuations.

The reader is once again reminded that this parameter (the coercive field as defined in relation to FIG. 2) can also be adjusted, not only by modifying the temperature of post-deposition heat treatments as illustrated in FIGS. 13, 14 and 15, but also by modifying the composition of the stack (thicknesses of the layers, nature of the ferromagnetic material, presence or absence of a second layer O'), by modifying the deposition conditions (rate, temperature, magnetic field) or by using a different technique or oxidation conditions (oxygen pressure, oxidation time, plasma power, etc.).

The invention also relates to a method for fabricating magnetic elements in accordance with the above descriptions. This method is defined as follows—this description makes no claim to exhaustively.

The various layers of the stacks described here are deposited by cathode sputtering, at deposition rates of the order of 0.1 nm/s, on silicon substrates covered with 500 nm of thermally oxidized silicon.

The oxide, hydride or nitride layers are produced by firstly depositing a layer of the corresponding material, then performing plasma oxidation, hydriding or nitriding of this layer with plasma powers of the order of 10 W at a pressure of $3 \times 10^{-3}$ mbar of oxygen, hydrogen or nitrogen for several seconds to several minutes.

Firstly, one deposits a layer of aluminium, for example, having a thickness of the order of 0.3 to 5 nm. The specimen is then subjected to oxygen plasma, for example, under clearly defined pressure, power and time conditions. This makes it possible to convert the metallic aluminium into aluminium oxide.

It is obvious that, because this alumina layer is electrically insulating, its thickness is far less critical than that of the other metal layers. This does not apply, however, if the oxide (or hydride or nitride) of the metal in question is electrically conductive. In the case of an insulating layer, determining its thickness depends both on the growth properties of the layer, the surface roughness of which may increase with thickness, thus having an adverse effect on the growth quality of subsequent layers, and on oxidation mechanisms that may possibly alter depending on the total thickness. The following examples relate to an aluminium thickness of 1.6 nm which is approximately equivalent to 2 nm of alumina once the metal layer has been oxidized.

This step of depositing the first layer O may possibly be omitted if the actual substrate (oxide or nitride-based substrate) constitutes first layer O.

A cobalt layer generally having a small thickness is then deposited. In the examples described below, the thickness of the cobalt layer was specified as 1.5 nm. Choosing a relatively small thickness also makes it possible not to reduce the resistivity of this layer too much compared with that of a thicker layer.

Conversely, reducing this thickness excessively could diminish intrinsic magnetisation of this layer or considerably reduce its magnetic order temperature. In both cases this would result in reduced effective magnetisation of this layer at the operating temperature of the magnetic element, namely close to ambient temperature. According to equation (1) this would result in reduced Hall resistivity and therefore a smaller output signal from the device. For other types of applications described in the present invention, one can increase the thickness of the magnetic layer up to 5 nm.

This oxide/magnetic metal or hydride/magnetic metal or nitride/magnetic metal bilayer can possibly be topped by a layer of a non-ferromagnetic metal, the purpose of which is either to protect the entire structure thus produced against subsequent natural oxidation or to facilitate the flow of an electric current or even to induce magnetic exchange coupling with the magnetic layer.

This oxide/magnetic metal or hydride/magnetic metal or nitride/magnetic metal bilayer can possibly be topped by an oxide, hydride or nitride layer fabricated using one of the techniques mentioned above making it possible to protect the entire structure thus produced against subsequent natural oxidation without thereby diminishing the electrical resistance of the stack in contrast to the case mentioned above.

Finally, it is possible to carry out heat treatments or magnetic treatments during or after deposition of the stack.

The term "heat treatments" is taken to mean subjecting the material thus prepared to a temperature that is higher than that at which it was deposited, for a longer or shorter period, in a rarefied atmosphere or in the presence of a certain gas or mixture of different gases such as oxygen, hydrogen or nitrogen, for example.

The term "magnetic treatments" is taken to mean applying a magnetic field that has a carefully chosen intensity and direction during one or more of the steps to deposit the various layers that constitute the stack or during one of the heat treatment steps described above.

The purpose of such heat and/or magnetic treatments is to increase the longitudinal resistivity of the stack by possibly disrupting the magnetic layer and/or forming an alloy at its interfaces. These treatments may also be intended to modify the chemical or crystallographic structure of the layers and consequently modify the magnetic properties of the stack thus produced.

The invention claimed is:

1. A three-layer magnetic element with a reduced effective demagnetising field or out-of-plane magnetisation comprising, on a substrate, a first oxide, hydride or nitride layer O having a metal magnetic layer M mounted thereon, the latter having either a second oxide, hydride or nitride layer O', or a non-ferromagnetic metal layer M' mounted thereon:
   wherein the layer M is continuous and has a thickness of 1 to 5 nm, and
   wherein there is, for a range of temperature equal to or greater than ambient temperature, interfacial magnetic anisotropy perpendicular to the layer plane on interfaces O/M and M/O' that is configured to decrease the effective demagnetising field of layer M or to orient the magnetisation of layer M in a manner substantially perpendicular to the layer plane.

2. The three-layer magnetic element as claimed in claim 1:
   wherein the magnetic metal layer M consists of a magnetic material, a magnetic alloy or a multilayer formed by an alternating sequence of non-magnetic and magnetic materials, the latter being selected from the group comprising Fe, Ni, Co or alloys thereof, and
   wherein the oxide, hydride or nitride layer(s) O and O' has/have a thickness of at least 0.3 nm and is/are based on elements selected from the group comprising Al, Mg, Ru, Ta, Cr, Zr, Hf, Ti, V, Si, Cu, W, Co, Ni, Fe or alloys thereof, or any material or alloy configured to form stable oxides, hydrides or nitrides.

3. The three-layer magnetic element as claimed in claim 1, wherein the substrate is made of silicon covered in thermally or naturally oxidized or nitrided silicon to a depth of 1 to 500 nm.

4. The three-layer magnetic element as claimed in claim 1, wherein the substrate is made of a transparent material.

5. The three-layer magnetic element as recited in claim 4, wherein the transparent material comprises at least one from the group consisting of glass and magnesium oxide.

6. The three-layer magnetic element as claimed in claim 1, wherein the substrate acts as first layer O.

7. The three-layer magnetic element as claimed in claim 6:
   wherein the metal magnetic layer M has a thickness of 1 to 5 nm, and
   wherein layers O and O' have a thickness of 0.3 to 5 nm.

8. The three-layer magnetic element as claimed in claim 1, wherein the layer M contains added non-magnetic metals Pd or Pt or elements selected from the group comprising Si, C, B, P.

9. The three-layer magnetic element as claimed in claim 1, wherein layers O and O' are made of the same non-magnetic material.

10. The three-layer magnetic element as claimed in claim 1, wherein layers O and O' have the same thickness.

11. The three-layer magnetic element as claimed in claim 1, wherein the thicknesses of layers O and O' are different.

12. The three-layer magnetic element as claimed in claim 1, wherein the chemical compositions of layers O and O' are different.

13. The three-layer magnetic element as claimed in claim 1, wherein at least one of layers O and O' itself consists of a plurality of layers made of oxide, hydride or nitride.

14. The three-layer magnetic element as claimed in claim 1, wherein non-ferromagnetic layer M' is made of an antiferromagnetic material known to induce exchange anisotropy coupling with magnetic layer M.

15. The three-layer magnetic element as claimed in claim 14, wherein a non-magnetic metal layer having a thickness of 0.1 to 1 nm is inserted between layer M and layer M' to induce exchange anisotropy coupling with said layer M.

16. The three-layer magnetic element as recited in claim 14, wherein the antiferromagnetic material comprises at least one from the group consisting of FeMn, IrMn, PtMn, and NiMn.

17. The three-layer magnetic element as claimed in claim 1, wherein said element is itself deposited on top of a first magnetic layer that also has either a reduced effective demagnetising field or magnetisation oriented substantially perpendicular to the layer plane.

18. The three-layer magnetic element as claimed in claim 1, wherein lateral dimensions of the three-layer magnetic element are less than 1 μm.

19. A magnetic field sensor consisting of a three-layer magnetic element as claimed in claim 1 having a perpendicular anisotropy field that almost counterbalances its demagnetising field.

20. A method for using a magnetic field sensor as claimed in claim 19, wherein the orientation of the magnetisation of the metal magnetic layer M of the magnetic element is detected by measuring an extraordinary Hall effect by injecting an electric current in a direction parallel to the layer plane.

21. A method for using a magnetic field sensor as claimed in claim 19, wherein the orientation of the magnetisation of the metal magnetic layer M of the magnetic element is detected by measuring a Kerr effect or a Faraday magneto-optical effect.

22. A method for using a magnetic field sensor as claimed in claim 19, wherein the orientation of the magnetisation of the metal magnetic layer M of the magnetic element is detected by measuring a magnetoresistance by injecting an electric current in a direction that is substantially perpendicular to the layer plane.

23. A magnetic memory consisting of a three-layer magnetic element as claimed in claim 1 in which magnetisation of the metal magnetic layer M is perpendicular to the layer plane in the absence of any external magnetic field.

24. A method for using a magnetic memory as claimed in claim 23, wherein the orientation of the magnetisation of the metal magnetic layer M of the magnetic element is detected by measuring a magnetoresistance of a magnetoresistive sensor located close to the magnetic element.

25. A magnetic memory consisting of a three-layer magnetic element as claimed in claim 1 in which magnetisation of the metal magnetic layer M is perpendicular to the layer plane in the form of magnetic domains that point alternately downwards and upwards.

26. A magnetic logic gate consisting of a three-layer magnetic element as claimed in claim 1 in which magnetisation of the metal magnetic layer M is perpendicular to the layer plane in the absence of any external magnetic field.

* * * * *